(12) United States Patent
Copley

(10) Patent No.: US 7,256,721 B2
(45) Date of Patent: Aug. 14, 2007

(54) NETWORK WITH MULTIPLE ADJUSTMENT ELEMENTS AND SENSITIVITIES, AND DIGITAL-TO-ANALOG CONVERTER IMPLEMENTING SAME

(75) Inventor: Patrick Philip Copley, Sunnyvale, CA (US)

(73) Assignee: Linear Technology Corporation, Milpitas, CA (US)

( * ) Notice: Subject to any disclaimer, the term of this patent is extended or adjusted under 35 U.S.C. 154(b) by 182 days.

(21) Appl. No.: 11/106,596

(22) Filed: Apr. 15, 2005

(65) Prior Publication Data
US 2006/0232458 A1 Oct. 19, 2006

(51) Int. Cl.
*H03M 1/66* (2006.01)

(52) U.S. Cl. .................. 341/144; 341/118; 341/145; 341/154; 333/172; 327/553

(58) Field of Classification Search ................ 341/154
See application file for complete search history.

(56) References Cited

U.S. PATENT DOCUMENTS

| | | | | |
|---|---|---|---|---|
| 4,551,709 A | * | 11/1985 | Merchant et al. | 341/136 |
| 4,843,394 A | * | 6/1989 | Linz et al. | 341/154 |
| 4,942,397 A | * | 7/1990 | Real | 341/118 |
| 5,969,658 A | | 10/1999 | Naylor | |
| 6,310,567 B1 | * | 10/2001 | Copley et al. | 341/139 |
| 6,573,811 B2 | * | 6/2003 | Martin | 333/172 |
| 6,937,179 B1 | * | 8/2005 | Martin | 341/154 |

FOREIGN PATENT DOCUMENTS

| | | |
|---|---|---|
| JP | 58-046667 | 3/1983 |
| JP | 2000-269815 A | 9/2000 |

* cited by examiner

*Primary Examiner*—Khai M. Nguyen
(74) *Attorney, Agent, or Firm*—McDermott Will & Emery LLP

(57) ABSTRACT

A network comprises an arrangement of regular structures and merged structures, in which the regular structures each comprise one or more mutually identical fixed elements and an equal number of adjustable elements of equal value, and the adjustable elements each comprising two or more adjustable units. The regular structures may comprise one or more mutually identical fixed elements and an equal number of adjustable elements of equal value. The adjustable elements each comprise two or more adjustable units, and the merged structures comprise N mutually identical fixed elements and one merged adjustable element. The merged adjustable elements have substantially the same value as that of N adjustable elements, where N is an integer equal to or greater than 2, and the merged elements each may comprise one or more adjustable units. The network accordingly is trimmable in a manner that uses minimum area and consumes minimum time during manufacture. A described application is in digital-to-analog converter trim circuitry.

26 Claims, 3 Drawing Sheets

NETWORK WITH MULTIPLE ADJUSTMENT ELEMENTS AND SENSITIVITIES, AND DIGITAL-TO-ANALOG CONVERTER IMPLEMENTING SAME

TECHNICAL FIELD OF THE INVENTION

This disclosure relates generally to networks, and more particularly to improvement in adjustment circuitry that may be implemented therein. One application of this improvement is in the field of digital-to-analog converter trim circuits.

BACKGROUND OF THE INVENTION

A class of networks is composed of network structures designed to have a transfer function (from one or more input nodes to an output node) that is responsive to at least one digital input signal in a prescribed manner. The digital input signal can be a pin-strappable or programmable logic input signal, or other suitable signal. The manufacturing tolerance of various network structures has a tendency to cause degradation in the accuracy of the transfer function. In order to increase the accuracy of the network transfer function, network structures typically include adjustment or trim elements. The value of the adjustable elements can be varied by a suitable means to increase the accuracy of the transfer function.

The accuracy of the transfer function of a network is modified by the influence of various structures throughout the network. The influence of these structures on the accuracy of the transfer function is referred to as the sensitivity of the structure on the transfer function. Higher sensitivity network structures require finer adjustments within a suitable adjustment range. The adjustable element has to be designed appropriately for the structure with the highest sensitivity.

It is well known to those skilled in the art that greater precision is often obtained by using network topologies for which the transfer function depends primarily on the ratio matching between similar or identical elements, and not on the absolute value of individual elements or on the ratio matching of dissimilar elements. Therefore, it has long been the common practice in the design and construction of precision networks to utilize such topologies, and furthermore to favor the use of essentially identical unit elements. The use of identical unit elements means that many sources of parameter variation, including manufacturing variability, tend to affect each unit element in the same manner. Therefore the ratio between unit element parameters remains largely unchanged. A further benefit of such practice is that post-manufacturing parameter drift due to a variety of causes, including temperature change, aging etc, also tends to effect each unit element in the same manner, and therefore has a reduced effect on the network transfer function.

Likewise it is well known that it is desirable to use identical adjustable unit elements throughout the various structures in the network, and to arrange them in a fixed ratio with respect to the fixed elements. This results in better initial matching and hence better initial transfer function accuracy and therefore reduced trim range requirements. However, network sections with high sensitivity may require adjustable elements with a large ratio between adjustment range and adjustment resolution, which in turn tends to require a large area and/or complex trim structure. If an identical adjustable element is used throughout the entire network, an excessive area may be consumed. Furthermore, for network sections with lower sensitivity this adjustable element may be considered to be over-designed, resulting in greater network area and required trim time to make adjustments in manufacturing. Conversely, using a single adjustable element structure throughout the network which has a more acceptable area and trim time requirements and has sufficient adjustment range and resolution for less sensitive sections of the network may result in inadequate trim range, resolution and stability in the more sensitive sections of the network. A specific, non-limiting, example of a possible network of this type is a digital-to-analog converter (DAC). A DAC converts a digital input word to an analog output signal. DACs typically operate in either a unipolar or bipolar mode. The generic equation for determining the output $V_{OUT}$ in unipolar and bipolar DACs is shown in Equation 1:

$$V_{OUT} = G * V_{REF} * \left( K1 * \frac{\text{INPUT CODE}}{2^n} - K2 \right) \quad (1)$$

where INPUT CODE is an n-bit digital word, G is the gain of the DAC and K1 and K2 are constants that determine the configuration mode. In unipolar mode configuration (e.g., when the output varies from 0 volts to $V_{REF}$), K1=1 and K2=0 so that $V_{OUT}$ varies between 0 and G*$V_{REF}$. In bipolar mode configuration (e.g., output varies from $-V_{REF}$ to $V_{REF}$), K1=2 and K2=1 so that $V_{OUT}$ varies between $-G*V_{REF}$ and $G*V_{REF}$. For the inverting unipolar configuration K1=-1 and K2=0 so that $V_{OUT}$ varies between 0 and $-G*V_{REF}$.

FIG. 1 shows the example of a well known architecture of an inverting unipolar 3-bit DAC 10, which receives input $V_{REF}$, control signal UPDATE and digital input INPUT CODE, and generates analog output $V_{OUT}$. The DAC of FIG. 1 has 3-bit resolution for illustration only and can easily be modified to any practical resolution desired. The digital input INPUT CODE is a 3-bit digital word used by DAC 10 to convert input $V_{REF}$ into analog output $V_{OUT}$. UPDATE is a binary control signal which determines when the digital word INPUT CODE can be used to convert $V_{REF}$ to produce a new $V_{OUT}$. When UPDATE is LOW, $V_{OUT}$ remains substantially constant. When UPDATE changes from LOW to HIGH, DAC 10 converts $V_{REF}$ to analog output $V_{OUT}$ based on the INPUT CODE.

DAC 10 comprises resistor network 12, switches $16_1$, $16_2$ and $16_3$, switch compensation element 17, switch control block 18, op-amp 22 and feedback element 20. Resistor network 12 is of a type commonly called an R-2R ladder, and includes substantially identical fixed unit resistors $23_{11}$, to $23_{42}$ and substantially identical adjustable trim elements $30_{11}$ to $30_{42}$. The input $V_{REF}$ is applied to input node 1 of DAC 10 while the output signal $V_{OUT}$ is produced at output node 3. An additional DAC node referred henceforth as GROUND is used as reference potential for both input $V_{REF}$ and output $V_{OUT}$. Resistor network 12 receives the input $V_{REF}$ on node 1, is connected to switches $16_1$, $16_2$ and $16_3$ through nodes $15_1$, $15_2$ and $15_3$, respectively, and to switch compensation element 17 through node $15_4$. It comprises a number of switched and series structures. The first switched structure comprises two fixed unit resistors, $23_{11}$ and $23_{12}$, and two adjustable trim elements $30_{11}$ and $30_{12}$, all connected in series, and is coupled between the input node 1 and node $15_1$. It functions as the most significant bit (MSB) of the ladder. The first series structure comprises fixed unit resistor $23_{13}$ and adjustable trim element $30_{13}$, connected in series, and is coupled between input node 1 and network internal node 4. The second switched structure comprises two fixed unit resistors, $23_{21}$ and $23_{22}$, and two adjustable trim elements $30_{21}$ and $30_{22}$, all connected in series, and is coupled between internal node 4 and node $15_2$. It functions as the second bit of the ladder. The second series structure comprises fixed unit resistor $23_{23}$ and adjustable trim element $30_{23}$, connected in series, and is coupled between internal node 4 and internal node 5. The third switched structure comprises two fixed unit resistors, $23_{31}$ and $23_{32}$, and two adjustable trim elements $30_{31}$ and $30_{32}$, all connected in series, and is coupled between internal node 5 and node $15_3$. It functions as the least significant bit (LSB) of the ladder. The last structure comprises two fixed unit resistors, $23_{41}$ and $23_{42}$, and two adjustable trim elements $30_{41}$ and $30_{42}$, all connected in series, and is coupled between internal node 5 and node $15_4$. It functions as the ladder termination and is connected to GROUND node through the switch resistance compensation element 17.

In describing an R-2R ladder, the series structures are conventionally called the R-branches, and the switched structures and the termination structure are called the 2R-branches. Switch control block 18 receives control input UPDATE and digital input INPUT CODE. When UPDATE changes state from LOW to HIGH, switch control block 18 adjusts the levels of switch control nodes $28_1$, through $28_3$, according the present state of INPUT CODE. In this example of a 3-bit DAC, INPUT CODE may be a 3-bit binary signal. When the most significant bit (MSB) of INPUT CODE is HIGH, the switch control 18 will set node $28_1$ such as to cause switch $16_1$ to couple node $15_1$ to node 2. When the most significant bit (MSB) of INPUT CODE is LOW, switch control 18 will set node $28_1$ such as to cause switch $16_1$ to couple node $15_1$ to GROUND. Similarly, a HIGH or LOW state in the second bit of INPUT CODE will result in switch control 18 setting node $28_2$ thus causing switch $16_2$ to couple node $15_2$ to node 2 or to GROUND respectively. A HIGH or LOW state in the third, least significant bit (LSB) of INPUT CODE will result in switch control 18 setting node $28_3$ thus causing switch $16_3$ to couple node $15_3$ to node 2 or to GROUND respectively. In the manner described, the digital input INPUT CODE in combination with input signal $V_{REF}$ causes an intermediate current, $I_{DAC}$ to flow into node 2 from the switch elements $16_1$ to $16_3$ according to Equation 2, where $R_{DAC}$ is the input impedance of the R-2R ladder:

$$I_{DAC} = \left(\frac{V_{REF}}{R_{DAC}}\right) * \left(\frac{\text{INPUT CODE}}{2^n}\right) \quad (2)$$
$$= \left(\frac{V_{REF}}{R_{DAC}}\right) * \left(\frac{\text{INPUT CODE}}{8}\right)$$

Feedback element 20 and op-amp 22 form a current-to-voltage converter. The op-amp 22 has an inverting input terminal (−) coupled to node 2, a non-inverting input terminal (+) coupled to GROUND, and an output terminal coupled to node 3. Feedback element 20, coupled between node 2 and node 3, creates a feedback loop around the op-amp 22. The resistance of feedback element 20, is commonly referred to as $R_{FB}$.

The current to voltage converter operates to convert intermediate current $I_{DAC}$ to the output voltage $V_{OUT}$. The resulting $V_{OUT}$ is shown in Equation 3:

$$V_{OUT} = -I_{DAC} * R_{FB} \quad (3)$$
$$= -V_{REF} * \left(\frac{R_{FB}}{R_{DAC}}\right) * \left(\frac{\text{INPUT CODE}}{2^N}\right)$$
$$= -V_{REF} * \left(\frac{R_{FB}}{R_{DAC}}\right) * \left(\frac{\text{INPUT CODE}}{8}\right)$$

For the 3-bit DAC example, MAX INPUT CODE=$2^3-1=7$, so for DIGITAL INPUT=0:

$V_{OUT}$=0V, corresponding to ZERO SCALE and for DIGITAL INPUT=7:

$$V_{OUT} = -V_{REF} * \left(\frac{R_{FB}}{R_{DAC}}\right) * \left(\frac{7}{8}\right), \text{ corresponding to FULL SCALE}$$

The prior art includes various configurations of DAC 10 from FIG. 1 in monolithic or discrete form. The configurations are typically chosen to be unipolar, bipolar or a combination thereof, such as a software programmable signal processor of a type described in U.S. Pat. No. 6,310,567, incorporated herein by reference.

It is generally recognized that the transfer function accuracy of resistor networks, of which the R-2R ladder shown in FIG. 1 is just an example, depend primarily upon the ratio matching of identical unit elements of constituent structures.

It is common practice to use identical fixed elements like fixed unit resistors $23_{11}$ through $23_{42}$ of network 12 when implementing such networks in order to minimize these matching errors. Nevertheless, matching errors between identical fixed elements are inherent in any practical implementation and result in transfer function linearity errors. The problem is alleviated by connecting trim elements like trim resistors $30_{11}$ through $30_{42}$ of network 12 in series with fixed network elements. These trim elements can be adjusted in a calibration process such as to correct the residual mismatch of the fixed elements. In order to reduce even further potential mismatch errors it is common practice to use trim elements which are mutually identical prior to any trimming and to associate a trim element to every fixed element in the network. In this manner every constituent structure of the network has the same ratio between the value and number of fixed elements to trim elements.

As a function of the network configuration, the sensitivity of various constituting structures varies with the structure position within the network. For an R-2R ladder like network 12, as one progresses down from the most significant bit (MSB) structure to the least significant bit (LSB) structure, the sensitivity is lowered by a factor of 2 for each adjacent less significant bit position. Hence the adjustable trim element positioned in a more significant bit structure and dimensioned for a given overall network transfer function accuracy can be said to be over designed when located in a less significant bit structure, wasting valuable area and trim time. Similarly an adjustable trim element positioned in a less significant bit structure and dimensioned for a given overall network transfer function accuracy is inadequate when located in a more significant bit structure.

The solution to this problem is to associate different trim structures to identical fixed elements function of their specific location within the network. This configuration does not use mutually identical fixed and mutually identical adjustable units throughout the network and thus suffers from higher initial errors hence requiring wider overall trim range, larger area and longer trim time. In addition such a network is substantially more sensitive to post-production variations like temperature, mechanical stress, aging, etc.

It will be apparent to those skilled in the art that the network configuration practiced herein described have general utility in a broad variety of network types and topologies, with applications including, but not restricted to: DAC's; ADC's; Programmable Amplifiers; Programmable Attenuators; Programmable Filters; Programmable Delay Elements; Programmable Resistors; and more.

Also, it will be apparent to those skilled in the art that the fixed and adjustable elements in these networks may consist of many different element types, singly or in combination, including but not limited to: resistors; capacitors; inductors; transistors; diodes; and more.

Furthermore, it will apparent to those skilled in the art that the adjustable elements may be adjusted by a wide variety of suitable means, including: laser trimming; fuse link trimming; anti-fuse link trimming; PROM control, programmable logic, and more.

SUMMARY OF THE INVENTION

Accordingly, it is the object of this invention to provide novel means of constructing networks that comprise a combination of fixed elements and adjustable elements, wherein furthermore, the pre-adjustment error depends primarily on the relative matching of identical adjustable units and identical fixed units, resulting in a reduced manufacturing requirement to maintain matching between dissimilar units.

In contrast to prior art networks, where the above objectives have required the use of substantially identical adjustment elements, an arrangement is provided whereby network structures of high sensitivity may use larger and/or more complex adjustable elements, and structures with lower sensitivity may use smaller and/or less complex adjustable elements. Simultaneously the pre-adjustment error is minimized by always constructing the adjustable elements of various sizes and values from identical adjustable element units. This error is further minimized by maintaining in all the network constituent structures a substantially fixed ratio between the value of the fixed and adjustable elements. In areas of higher sensitivity, mutually identical fixed elements are paired one-to-one with mutually identical adjustable elements. In areas of lower sensitivity, N fixed elements, where N>2, are associated with a single merged adjustable element, said element having the same value as a combination of N adjustable elements. The ratio between the value of the combined N fixed elements and the single merged adjustable element is the same as before, but the merged adjustable element is smaller than the combination of N identical adjustable elements.

BRIEF DESCRIPTION OF THE DRAWINGS

The present invention is illustrated by way of example, and not by way of limitation, in the figures of the accompanying drawing and in which like reference numerals refer to similar elements and in which.

DETAILED DESCRIPTION OF THE INVENTION

Figure 1:
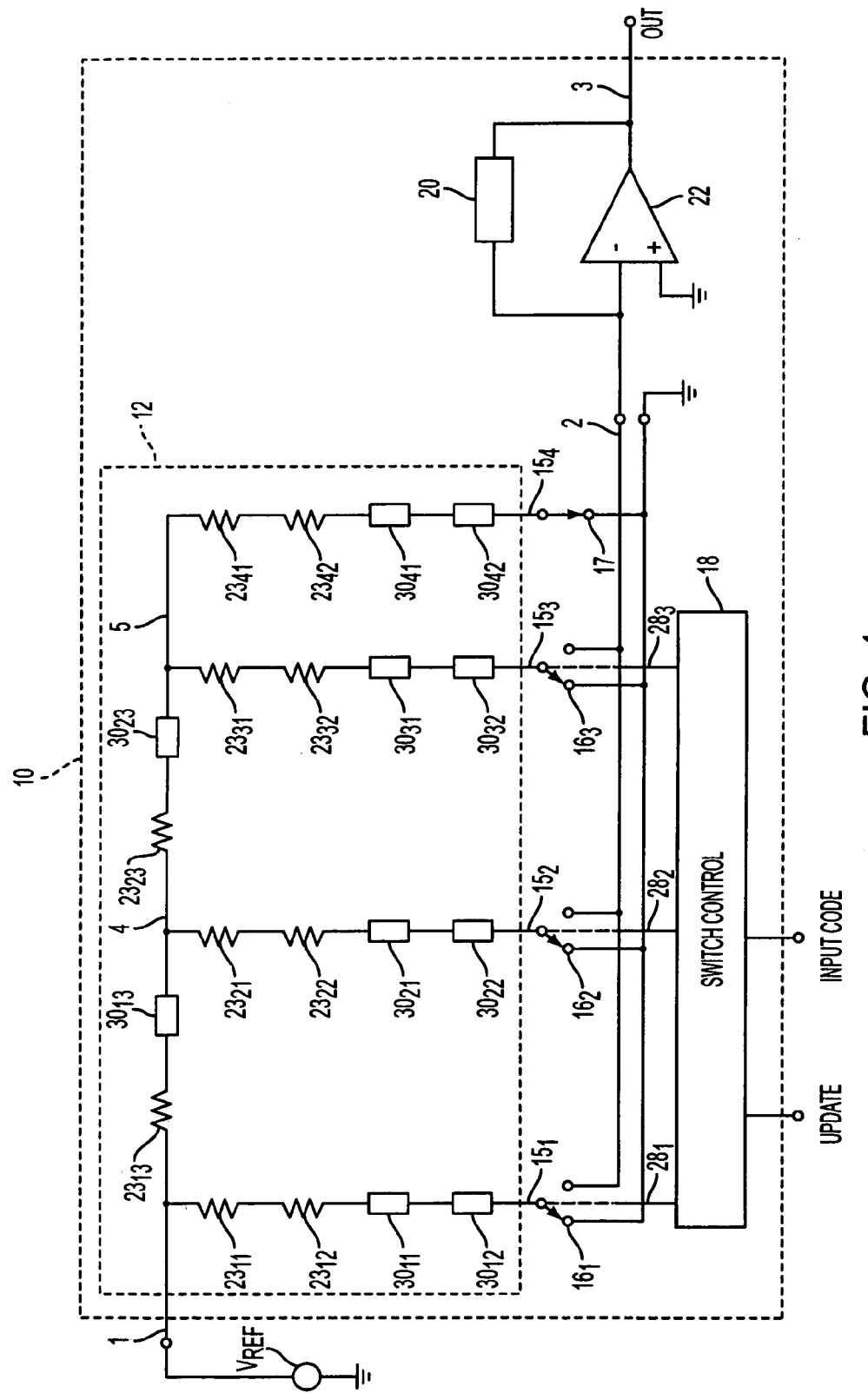
FIG. 1 is a circuit diagram showing a conventional inverting unipolar DAC based on a resistor network with trim structures.
Figure 2:
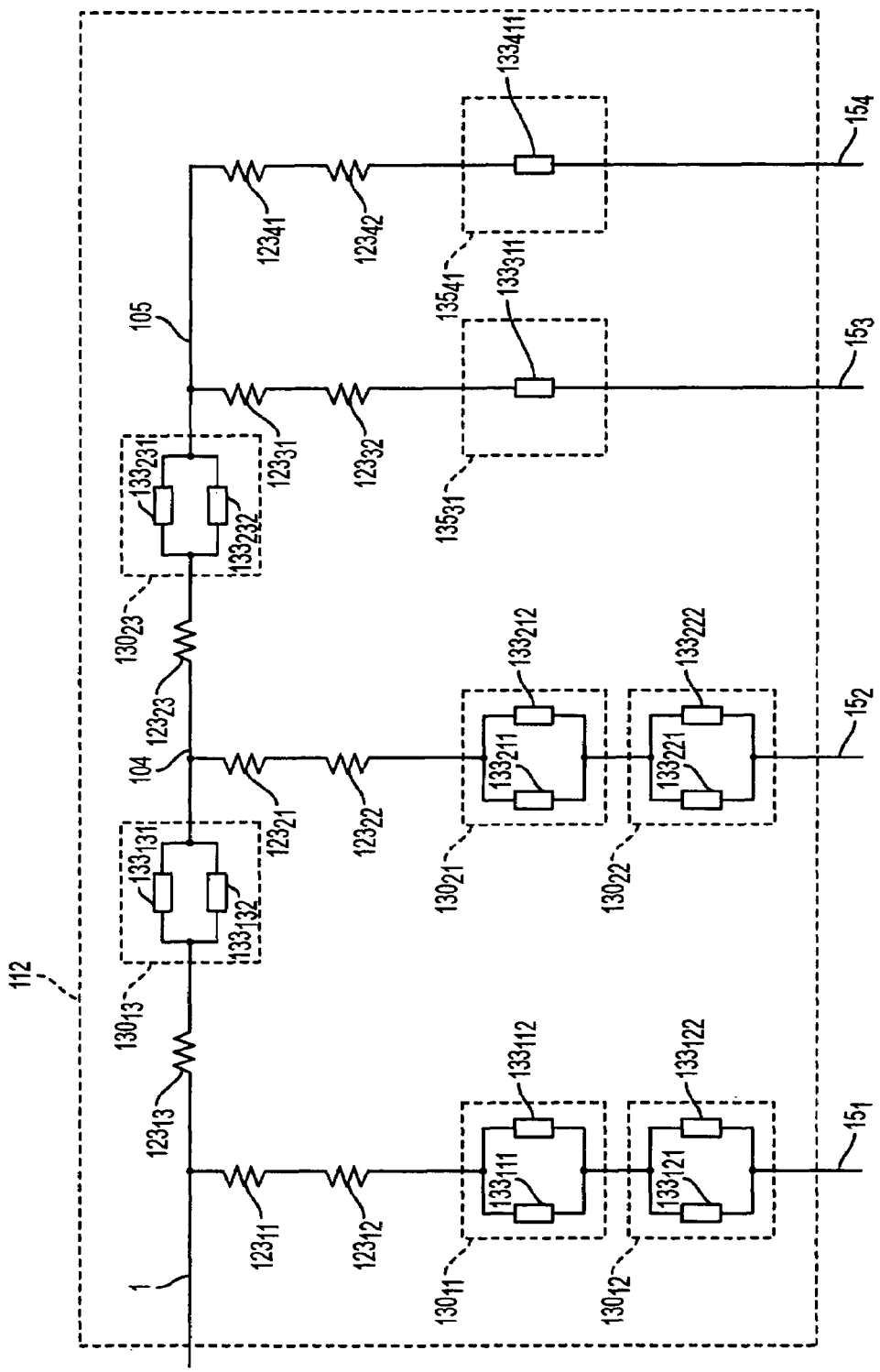
FIG. 2 is a specific embodiment of a resistor network section according to the present invention.

FIG. 2 shows resistor network 112 of a 3-bit DAC according to an embodiment of the present invention. It may be substituted for resistor network 12 of FIG. 1 to form an inverting unipolar 3-bit DAC, in which case all of the other components in the circuit of FIG. 1 function exactly as described above.

Resistor network 112 is also an R-2R ladder, and it includes substantially identical fixed elements $123_{11}$ to $123_{42}$ and substantially identical adjustable trim units $133_{111}$ to $133_{411}$. Resistor network 112 has input node 1, switch connection nodes $15_1$, $15_2$ and $15_3$, and switch compensation element connection node $15_4$. It comprises a number of switched and series structures. The first switched structure comprises two fixed unit resistors, $123_{11}$ and $123_{12}$, and two adjustable trim elements $130_{11}$ and $130_{12}$, all connected in series, and is coupled between the input node 1 and node $15_1$. It functions as the most significant bit (MSB) of the ladder. The first series structure comprises fixed unit resistor $123_{13}$ and adjustable trim element $130_{13}$, connected in series, and is coupled between input node 1 and network internal node 104. The second switched structure comprises two fixed unit resistors, $123_{21}$ and $123_{22}$, and two adjustable trim elements $130_{21}$ and $130_{22}$, all connected in series, and is coupled between internal node 104 and node $15_2$. It functions as the second bit of the ladder. The second series structure comprises fixed unit resistor $123_{23}$ and adjustable trim element $130_{23}$, connected in series, and is coupled between internal node 104 and internal node 105. The third switched structure comprises two fixed unit resistors, $123_{31}$, and $123_{32}$, and one merged adjustable trim element $135_{31}$, connected in series, and is coupled between internal node 105 and node $15_3$. It functions as the least significant bit (LSB) of the ladder. The last structure comprises two fixed unit resistors, $123_{41}$ and $123_{42}$, and one merged adjustable trim element $135_{41}$, connected in series, and is coupled between internal node 105 and node $15_4$. It functions as the ladder termination.

Adjustable trim element $130_{11}$ comprises two adjustable trim units, $133_{111}$ and $133_{112}$, connected in parallel. Adjustable trim element $130_{12}$ comprises two adjustable trim units, $133_{121}$ and $133_{122}$, connected in parallel. Adjustable trim element $130_{21}$ comprises two adjustable trim units, $133_{211}$ and $133_{212}$, connected in parallel. Adjustable trim element $130_{22}$ comprises two adjustable trim units, $133_{221}$ and $133_{222}$, connected in parallel. Merged adjustable trim element $135_{31}$ comprises one adjustable trim unit, $133_{311}$. Merged adjustable trim element $135_{41}$ comprises one adjustable trim unit, $133_{411}$.

The utility and benefits of resistor network 112 may be explained by comparing it to the prior art resistor network 12 of FIG. 1. It will be readily apparent to one skilled in the art that the transfer functions of these two networks are nominally identical if the adjustable trim elements $30_{11}$, $30_{12}$, $30_{13}$, $30_{21}$, $30_{22}$, and $30_{23}$, of resistor network 12 are defined to have the same value as the adjustable trim elements $130_{11}$, $130_{12}$, $130_{13}$, $130_{21}$, $130_{22}$, and $130_{23}$, of resistor network 112 respectively, the series combination of the adjustable trim elements $30_{31}$ and $30_{32}$ is defined to have the same value as the adjustable trim element $135_{31}$ and finally the series combination of the adjustable trim elements $30_{41}$ and $30_{42}$ is defined to have the same value as the adjustable trim element $135_{41}$. This can be immediately accomplished if the identical adjustable units $133_{111}$ to $133_{411}$ of network 112 are sized to have twice the value of the identical trim elements $30_{11}$ to $30_{42}$ of network 12.

The network 112, similar to network 12 continues to experience only minimal pre-trim matching errors because it is implemented using only mutually identical fixed resistors and mutually identical trim resistors. These errors are further reduced by continuing to maintain a substantially fixed ratio between the value of the fixed resistance and the value of the adjustable resistance in all the network constituent structures. Nevertheless the network 112 has substantial advantages over the prior art network 12 with respect to the trim element area and necessary trim time.

It is common practice, when constructing such networks, to use for implementing adjustable elements multiple trim units in parallel/series combinations in order to increases the available trim resolution while decreasing the used trim area. The network transfer function sensitivity to mismatch errors is substantially higher for the more significant bit structures which greatly benefit from such an increase in trim range and resolution. At the same time the least significant bit structures do not require the extended trim capabilities and the use of identical trim elements becomes an unnecessary burden. This problem is solved by the example network 112. Towards this goal, in the low sensitivity LSB and termination structures, the adjustable elements have been replaced with merged elements of substantially equal value implemented using the same identical adjustable units. Thus the overall trim area and trim time have been reduced while continuing to provide minimum pre-trim matching errors. Again, it will be readily apparent to those skilled in the art that the 3-bit DAC resistor network of FIG. 2 can be readily expanded to N-bits, and that the method shown of using merged trim structures will still apply and will have equal or greater benefits for DACs of increased resolution.

Also, it will be apparent to those skilled in the art that the simple, but useful example shown in network 112 of FIG. 2 can be applied in a straightforward manner to un-merged and merged trim structures that comprise many different combinations of trim units in parallel and/or series combination.

Furthermore, it will be apparent to those skilled in the art that the structures and techniques described in the example network of FIG. 2 have the same broad range of applications as the circuit example of FIG. 1, and also that networks consisting of the same variety of components, and adjustments may be applied in the same variety of suitable means as described above for FIG. 1.

Figure 3:
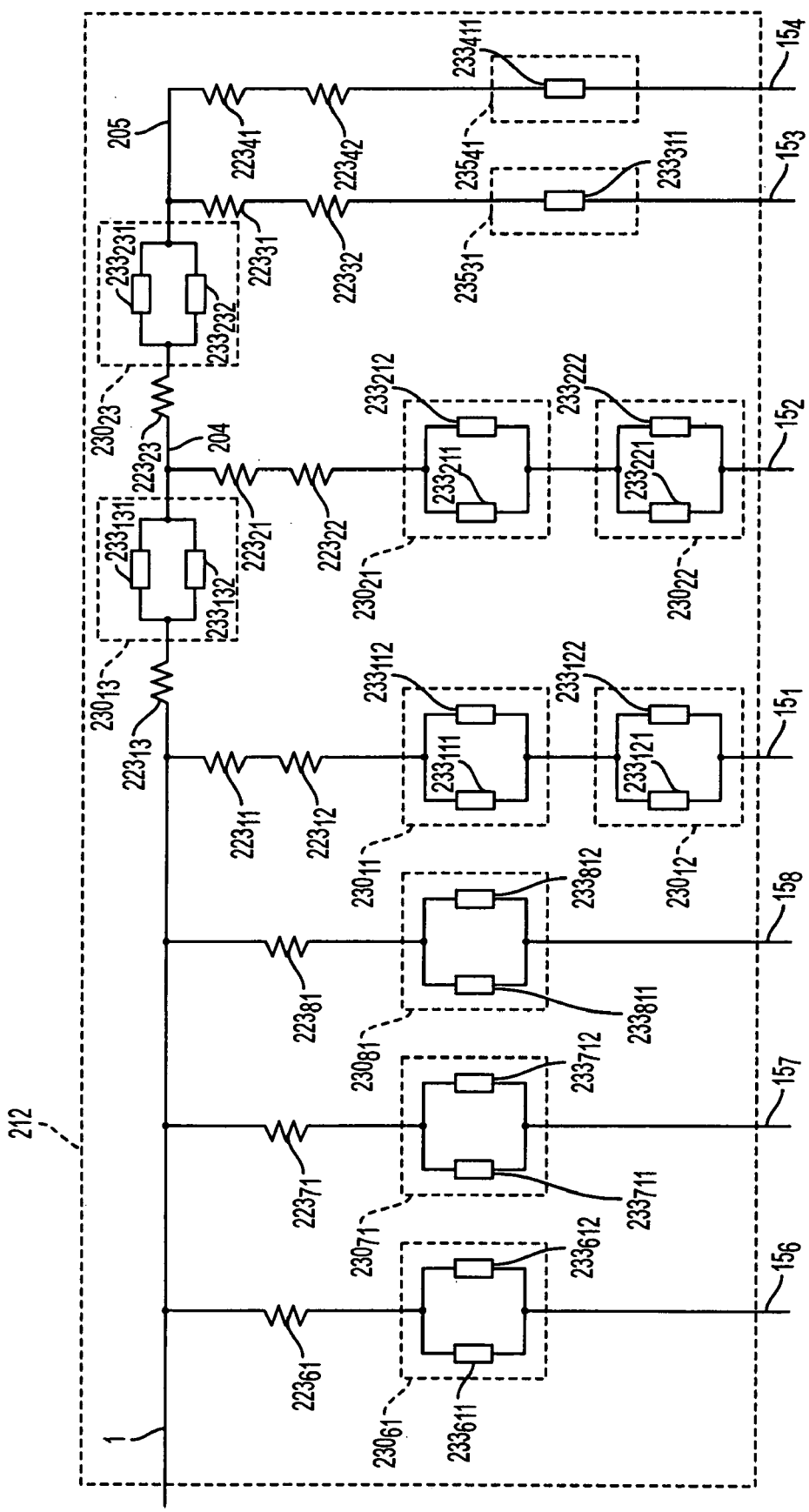
FIG. 3 is an alternative embodiment of a resistor network section according to the present invention.

FIG. 3 shows an alternative embodiment of the invention as it applies to a partially segmented resistor ladder. Resistor network 212 may constitute the resistor network of a 5-bit DAC, similar in application to the 3-bit DAC examples of FIGS. 1 and 2. To form a complete inverting unipolar 5-Bit DAC the resistor network 212 may be combined with elements such as those described in detail in FIG. 1, including switches, switch control block, switch resistance compensation element, op-amp and feedback element using widely known common practice.

Resistor network 212 represents a known variation on the R-2R ladder networks discussed earlier and is usually referred to as a "partially segmented resistor ladder". The term 'segmented' comes from the fact that the DAC switched branches no longer all correspond directly to binary weighted bits of a digital input as is the case of a classic R-2R ladder. The first $2^n-1$ equal resistor 'segments' of the network correspond to the n most significant bits of a digital input. The switch control signals corresponding to these segments are decoded from the n most significant bits of a binary encoded digital input INPUT CODE into a widely known 'thermometer code'. This 'thermometer code' is subsequently used to control the switches connected to the first $2^n-1$ equal 'segments'. Partially segmented resistor ladders are widely used because of a reduced sensitivity of the transfer function to any one branch of the resistor ladder.

Resistor network 212 includes substantially identical fixed elements $223_{11}$ to $223_{81}$ and substantially identical adjustable units $233_{111}$ to $233_{812}$. It has input node 1, switch connection nodes $15_1$, $15_2$, $15_3$, $15_6$, $15_7$, and $15_8$, and switch compensation element connection node $15_4$.

It comprises a number of switched and series branches. The first binary weighted switched structure comprises two fixed unit resistors, $223_{11}$ and $223_{12}$, and two adjustable trim elements $230_{11}$ and $230_{12}$, all connected in series, and is coupled between input node 1 and node $15_1$. It functions as the most significant bit of the R-2R section and the third most significant binary bit of the network. The first series structure comprises fixed unit resistor $223_{13}$ and adjustable trim element $230_{13}$, connected in series, and is coupled between input node 1 and internal node 204. The second binary weighted switched structure comprises two fixed unit resistors, $223_{21}$ and $223_{22}$, and two adjustable trim elements $230_{21}$ and $230_{22}$, all connected in series, and is coupled between internal node 204 and node $15_2$. It functions as the fourth most significant binary bit of the network. The second series structure comprises fixed unit resistor $223_{23}$ and adjustable trim element $230_{23}$, connected in series, and is coupled between internal node 204 and internal node 205. The third binary weighted switched structure comprises two fixed unit resistors, $223_{31}$ and $223_{32}$, and one merged adjustable trim structure $235_{31}$, connected in series, and is coupled between internal node 205 and node $15_3$. It functions as the least significant binary bit (LSB) of the network. The last structure comprises two fixed unit resistors, $223_{41}$ and $223_{42}$, and one merged adjustable trim element $235_{41}$, connected in series, and is coupled between internal node 205 and node $15_4$. It functions as the network termination. The first switched segment structure comprises one fixed unit resistor, $223_{61}$, and one adjustable trim element $230_{61}$, connected in series, and is coupled between input node 1 and node $15_6$. It functions as the first segment of the most significant two bits of the network. The second switched segment structure comprises one fixed unit resistor, $223_{71}$, and one adjustable trim structure $230_{71}$, connected in series, and is coupled between input node 1 and node $15_7$. It functions as the second segment of the most significant two bits of the network. The third switched segment structure comprises one fixed unit resistor, $223_{81}$, and one adjustable trim structure $230_{81}$, connected in series, and is coupled between input node 1 and node $15_8$. It functions as the third segment of the most significant two bits of the network.

Adjustable trim element $230_{11}$ comprises two adjustable trim units, $233_{111}$ and $233_{112}$, connected in parallel. Adjustable trim element $230_{12}$ comprises two adjustable trim units, $233_{121}$ and $233_{122}$, connected in parallel. Adjustable trim element $230_{21}$ comprises two adjustable trim units, $233_{211}$ and $233_{212}$, connected in parallel. Adjustable trim element $230_{22}$ comprises two adjustable trim units, $233_{221}$ and $233_{222}$, connected in parallel.

Adjustable trim element $230_{61}$ comprises two adjustable trim units, $233_{611}$ and $233_{612}$, connected in parallel. Adjustable trim element $230_{71}$ comprises two adjustable trim units, $233_{711}$ and $233_{712}$, connected in parallel. Adjustable trim element $230_{81}$ comprises two adjustable trim units, $233_{811}$ and $233_{812}$, connected in parallel. Merged adjustable trim element $235_{31}$ comprises one adjustable trim unit, $233_{311}$. Merged adjustable trim element $235_{41}$ comprises one adjustable trim unit, $233_{411}$.

The high sensitivity elements of network 212 are the three switched segment structures, the first and second binary switched structures and the two series structures, all corresponding to more significant bits. These elements are implemented as REGULAR STRUCTURES comprising mutually identical fixed elements and mutually identical adjustable elements. Furthermore within each structure the number of adjustable elements equals the number of fixed elements thus maintaining a constant ratio between the total value of the comprised fixed elements and the total value of the comprised adjustable elements prior to any adjustment. The REGULAR STRUCTURE, through the use of relatively complex adjustable elements provides a large trim range and trim resolution.

The low sensitivity elements of network 212 are the LSB structure and the termination structure. These elements are implemented as MERGED STRUCTURES comprising mutually identical fixed elements and merged adjustable elements. The merged adjustable elements do not have to be identical to each other or to regular adjustable elements but they must be constructed from the same mutually identical trim units as the regular adjustable elements. With the purpose of minimizing pre-trim errors, this first limitation ensures that both REGULAR STRUCTURES and MERGED STRUCTURES within network comprise only mutually identical fixed elements and mutually identical adjustable elements. Furthermore the value of a merged adjustable element located in a MERGED STRUCTURE together with N fixed elements must be equal with the combined value of N regular adjustable elements. N is an integer greater than or equal to 2. Towards the same goal of minimizing pre-trim errors this second limitation ensures that all constituent network structures maintain the same constant ratio between the total equivalent value of comprised fixed elements and the total equivalent value of comprised adjustable elements prior to any adjustment A principal benefit of this architecture resides in the substantial reduction in size of the trim elements present in low sensitivity network structures without degradation of an optimal pre-adjustment matching accuracy. This reduction in size results in a decrease in the available trim range and resolution for the low sensitivity structures which is consistent with their reduced effect upon the global network transfer function.

It will be apparent to those skilled in the art that all variations and extensions previously mentioned for the circuits of FIG. 2 apply directly to the circuit of FIG. 3, including number of DAC bits, range of appropriate applications, variation of network element types and variety of means of applying the adjustments.

What is claimed is:

1. A network, comprising:
   an arrangement of regular structures and merged structures;
   the network being constructed from mutually identical fixed elements and mutually identical adjustable units;
   the regular structures each comprising one or more said fixed elements and adjustable elements;
   wherein, in any regular structure, the number of adjustable elements equals the number of fixed elements, the adjustable elements are of mutually equal value before adjustment, and the adjustable elements each comprises two or more said adjustable units; and
   the merged structures each comprises N said mutually identical fixed elements and only one merged adjustable element, wherein prior to adjustment, the merged adjustable element has substantially the same value as a composite value of N adjustable elements of a regular structure, where N is an integer equal to or greater than 2, and the merged adjustable element comprises fewer adjustable units than a corresponding group of N adjustable elements.

2. The network as recited in claim 1, wherein the elements and units are resistors.

3. The network as recited in claim 1, wherein the elements and units are capacitors.

4. The network as recited in claim 1, wherein the elements and units are a combination of resistors and capacitors.

5. The network as recited in claim 1, wherein the adjustable units are laser trimmable.

6. The network as recited in claim 1, wherein the adjustable units are fuse trimmable.

7. The network as recited in claim 1, wherein the value of some or all of the adjustable units are under the control of a digital signal.

8. The network as recited in claim 1, wherein at least some of the regular or merged structures include switches, said switches being controlled by a digital input signal.

9. The network as recited in claim 8, wherein part or all of the network is of an R-2R resistance ladder configuration.

10. The network as recited in claim 8, wherein part or all of the network is of segmented resistance ladder configuration.

11. The network as recited in claim 8, wherein the network is part of a digital-to-analog converter.

12. The network as recited in claim 11, wherein the network is part of an analog-to-digital converter.

13. The network as recited in claim 8, wherein the network is part of a programmable gain amplifier.

14. The network as recited in claim 8, wherein the network is part of a programmable attenuator.

15. The network as recited in claim 8, wherein the switches included in the merged structures are controlled by one or more but not all of the bits of the digital input signal.

16. The network as recited in claim 8, wherein the switches included in the regular structures are controlled by one or more of the more significant bits of the digital input signal.

17. The network as recited in claim 1, wherein the merged adjustable element comprises only one adjustable unit.

18. A digital-to-analog converter comprising:
   an input node;
   switches providing an input digital signal;
   an output node;
   a resistance ladder coupled to the switches, the ladder including branches corresponding respectively to bit positions, in which selective operation of the switches in response to the input digital signal produces a corresponding analog output signal at an output node;
   said ladder comprising regular branches and merged branches and being constructed from identical fixed resistors and identical trim resistors;
   said regular branches each comprising one or more mutually identical fixed resistors and trim elements, the trim elements being of mutually equal value before any trimming and each comprising two or more trim resistors;

said regular branch comprising a number of trim elements equal to the number of fixed elements;

said merged branches each comprising N mutually identical fixed resistors and one merged trim element, where N is an integer equal to or greater than 2, in which prior to any trimming, the merged trim element has substantially the same value as a composite value of N trim elements of a regular branch, and wherein the merged trim element comprises fewer trim resistors than a corresponding group of N trim elements.

19. The digital-to-analog converter as recited in claim 18, wherein said merged branch is provided in one or more, but not all, bit positions of the ladder.

20. The digital-to-analog converter as recited in claim 18, wherein said regular branch is provided only in one or more of the more significant bit positions of the ladder.

21. The digital-to-analog converter as recited in claim 18, in which at least a part of the resistance ladder is of an R-2R configuration.

22. The digital-to-analog converter as recited in claim 18, in which at least a part of the resistance ladder is of a segmented configuration.

23. The digital-to-analog converter as recited in claim 18, in which at least some of the trim resistors are laser-trimmable resistors.

24. The digital-to-analog converter as recited in claim 18, wherein at least some of the trim resistors are fuse trimmable.

25. The digital-to-analog converter as recited in claim 18, in which one or more trim elements comprise two trim resistors connected in parallel, and one or more said merged branches each comprise two fixed resistors connected in series and one merged trim element, and wherein said trim element comprises a single trim resistor.

26. The converter as recited in claim 18, wherein the merged trim element comprises only one trim resistor.

* * * * *